United States Patent
Nelson et al.

(10) Patent No.: US 9,501,376 B2
(45) Date of Patent: Nov. 22, 2016

(54) TESTING I/O TIMING DEFECTS FOR HIGH PIN COUNT, NON-CONTACT INTERFACES

(71) Applicants: Christopher Nelson, Gilbert, AZ (US); Bharani Thiruvengadam, Beaverton, OR (US)

(72) Inventors: Christopher Nelson, Gilbert, AZ (US); Bharani Thiruvengadam, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 234 days.

(21) Appl. No.: 14/270,503

(22) Filed: May 6, 2014

(65) Prior Publication Data

US 2015/0324265 A1    Nov. 12, 2015

(51) Int. Cl.
*G06F 11/22*    (2006.01)
*G06F 11/263*    (2006.01)
*G01R 31/317*    (2006.01)
*G06F 11/27*    (2006.01)

(52) U.S. Cl.
CPC ......... *G06F 11/263* (2013.01); *G06F 11/221* (2013.01); *G01R 31/31713* (2013.01); *G01R 31/31715* (2013.01); *G01R 31/31727* (2013.01); *G06F 11/2221* (2013.01); *G06F 11/27* (2013.01)

(58) Field of Classification Search
CPC .......... G06F 11/221; G06F 11/2221; G06F 11/263; G06F 11/27; G01R 31/317; G01R 31/31712; G01R 31/31713; G01R 31/31715; G01R 31/31716; G01R 31/31717; G01R 31/31727; G01R 31/3177; G01R 31/2828; G11C 29/2101

See application file for complete search history.

(56) References Cited

U.S. PATENT DOCUMENTS

| | | | |
|---|---|---|---|
| 8,570,881 B2 | 10/2013 | Talbot et al. | |
| 8,817,932 B2 | 8/2014 | Ho et al. | |
| 8,989,329 B2 | 3/2015 | Hammad et al. | |
| 9,208,836 B1 | 12/2015 | Ware | |
| 2004/0057404 A1* | 3/2004 | Maucksch | H04L 1/20 370/333 |
| 2004/0128601 A1* | 7/2004 | Muljono | G01R 31/31716 714/734 |
| 2010/0142391 A1* | 6/2010 | Ishikawa | H04L 43/50 370/252 |
| 2010/0153799 A1 | 6/2010 | Maroni et al. | |
| 2012/0017118 A1* | 1/2012 | Barakat | G06F 11/221 714/37 |
| 2012/0017138 A1* | 1/2012 | Erez | G06F 11/1004 714/773 |
| 2014/0002102 A1 | 1/2014 | Rangarajan et al. | |
| 2014/0019817 A1* | 1/2014 | Park | G06F 11/221 714/712 |
| 2014/0084954 A1 | 3/2014 | Wig | |
| 2014/0197409 A1* | 7/2014 | Partsch | H01L 25/18 257/48 |
| 2014/0237301 A1 | 8/2014 | Mejia et al. | |

\* cited by examiner

*Primary Examiner* — Esaw Abraham
*Assistant Examiner* — Christian Dorman
(74) *Attorney, Agent, or Firm* — Compass IP Law PC

(57) ABSTRACT

Indirect testing of multiple I/O interface signal lines concurrently. A system distributes a test data sequence to a group of signal lines. Each signal line receives the test data sequence and checks for errors in receiving the test data sequence at an associated I/O buffer. The system includes an error detection mechanism for each signal line. The system also includes an error detection mechanism for the group of multiple signal lines. If the I/O buffer receives any bit of the test data sequence incorrectly, the signal line error detection indicates an error. The group error detection accumulates pass/fail information for all signal lines in the group. Rather than sending a pass/fail indication on every cycle of the test, the group error detection can count pass/fail information for all signal lines of the group for all bits of the test data sequence and indicate error results after the entire test data is received.

20 Claims, 7 Drawing Sheets

TESTING I/O TIMING DEFECTS FOR HIGH PIN COUNT, NON-CONTACT INTERFACES

FIELD

Embodiments of the invention are generally related to device I/O (input/output), and more particularly to testing I/O timing defects for devices with wide interfaces.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2014, Intel Corporation, All Rights Reserved.

BACKGROUND

Computing and electronic devices continue to get smaller, even while performance remains the same or increases. Smaller computing and electronic devices are made possible by smaller electronic components. Some newer electronic circuit components have wide interfaces, and the manufacturing processes continue to enable smaller geometries on the components. Manufacturing processes can currently generate components that have a large number of I/O (input/output) signals lines in an I/O interface, and with a pitch between the signal lines that cannot practically be contacted for direct AC and DC performance testing. It will be understood that AC (alternating current) performance refers to the exchange of signals over the interface, and DC (direct current) performance refers to the biasing or voltage levels applied to signals, and parasitic leakage paths.

The decreasing size of the electronic components and the pitch between signal lines increases the difficulty of testing the devices. For many devices, the number of signal lines and the small pitch makes it impractical to directly test the I/O interface. A lack of direct testing has increased the risk that device manufacturers will not be able to achieve ultralow defects per million (DPM) targets with traditional testing. One specific area of technology in which such risks are currently being presented is with wide interface memory devices. Available testing methods are not practical in mass production (e.g., HVM (high volume manufacturing)) where the time required to test devices serially would be prohibitive.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
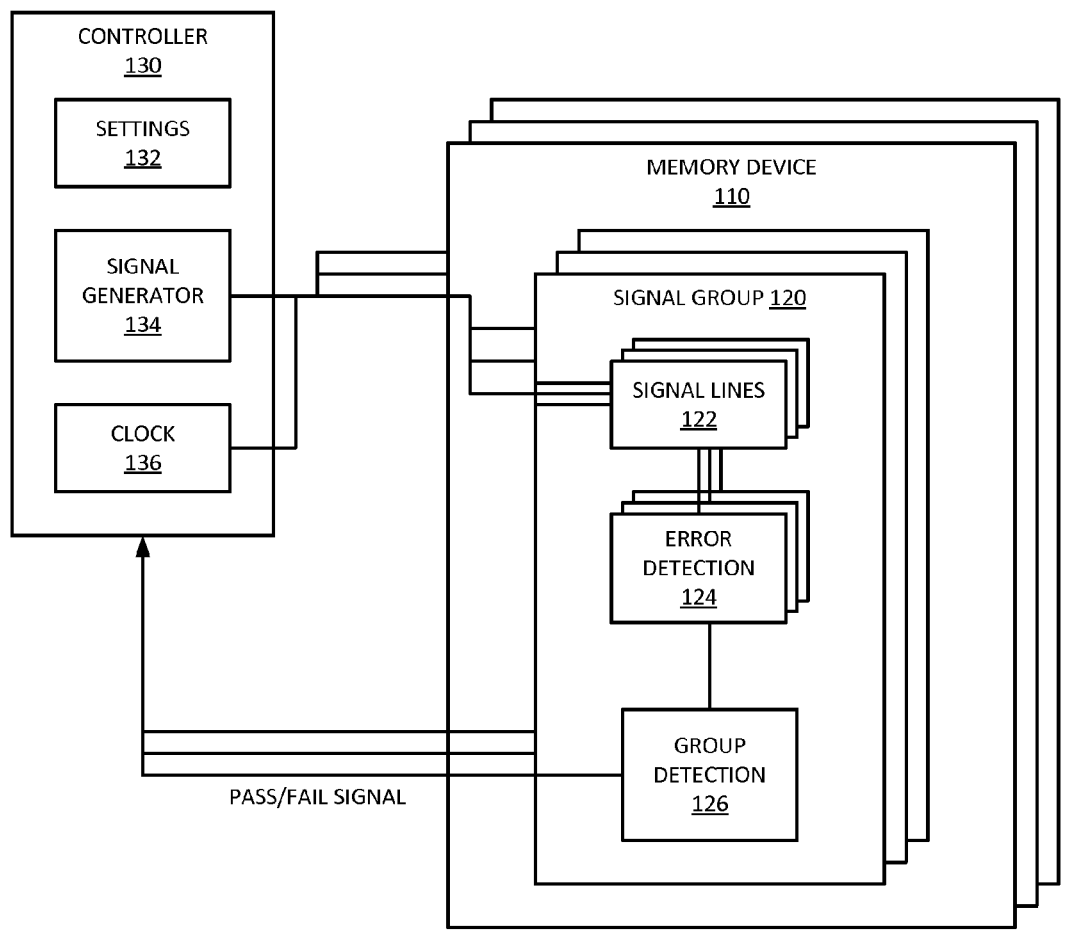
FIG. 1 is a block diagram of an embodiment of a system that provides indirect I/O testing of a wide interface by use of signal line groups.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a system indirectly tests I/O (input/output) interface signal lines in parallel or concurrently with groups of signal lines. A test source generates test data that can be distributed to a group of signal lines. Each signal line has an associated error detection mechanism. When the group of signal lines receives the test data, each error detection mechanism checks for errors in receiving the test data by an I/O buffer associated with the signal line. Each group has an associated group error detection mechanism and accumulates pass/fail information for all signal lines in the group based on the error detection. Thus, if any I/O buffer of the group does not receive any bit of the test data correctly, the signal line error detection indicates an error, which then affects the pass/fail information accumulated by the group error detection mechanism. Instead of sending a pass/fail indication on every iteration, the group error detection can count pass/fail information for all signal lines of the group for all bits of the test data and indicate error results after the entire test data is received.

A signal group or a group of multiple signal lines refers to multiple signal lines that share a common timing signal or a common clock. For example, in certain memory devices, there can be a number of DQs (data signal) and associated DMI signals that share a common pair of DQS signals. The indirect testing with the groups of signal lines can allow simultaneous testing of a valid eye width of data signals for all signal groups of all channels within an interface. Additionally, the testing can enable the testing of multiple devices, each with a separate I/O interface, in parallel or concurrently. The testing can allow the testing of multiple or all circuit die of a semiconductor wafer. A single test data sequence can be distributed to multiple devices, to each channel on each device, to each group on each channel, and to each signal line of each group. By accumulating pass/fail information for the group, the system can significantly reduce the bandwidth required to send test results back to the test source. Instead of indicating pass or fail on each data bit for each signal line, a group can send back a value indicating a pass or fail for the group and/or the number of passing and failing bits. Testing various words and/or channels in parallel or concurrently can capture the impact of power supply noise, especially when the supply is shared, either at the die, the package, or board level. Thus, the system can test the impact of various stresses on the I/O operation.

The system can test the data eye width by adjusting one or more timing settings for multiple testing iterations. For example, the test data can be distributed to all signal lines for one timing setting, and then distributed to all signal lines again for a different timing setting. The test data can be the identical sequence of bits, but with different I/O interface parameters controlling how the signal lines receive and sample the signal. The system can generate an error result for each timing setting, and can thus determine the width of the eye by monitoring the number of errors received by the signal groups for the different settings. The test system can measure the width of the eye as a composite data eye size of all signals within a signal group. The system can count the number of test iterations which capture the correct data on all I/O buffers or pins of the signal group for all data cycles, which can then provide an indirect eye size width. In one embodiment, signal groups and entire devices (I/O interfaces) can be compared against each other to determine if they fall within a statistical pattern of errors. For example, the system can determine that a signal group passes the test when its number of errors is within a low and high threshold. Signal groups whose number of errors falls outside the target range can be deemed to have failed the test.

In one embodiment, such testing can be particularly useful for testing emerging memory designs. For example, memory designs such as WIO (Wide IO,), WIO2 (Wide IO2, JESD229 December 2011, available from JEDEC (Joint Electronic Device Engineering Council)), and HBM (high bandwidth memory, JESD235 October 2013, available from JEDEC) DRAM designs, or other memory devices that have wide I/O interfaces. Such devices have a large number of signal lines in the device interfaces, and the feature size of the manufacturing techniques used to produce such devices can result in devices that cannot practically be tested using traditional direct contact methods. For example, WIO2 includes up to eight 64-bit data channels and HBM includes up to eight 128-bit data channels. The testing described herein can enable memory device suppliers/manufacturers to effectively screen for I/O defects in production testing that is compatible with HVM. It will be understood that in addition to memory device designs, the testing described herein can be applied to logic devices and/or SOCs (system on a chip) that are designed with wide I/O interfaces. In one example, certain logic devices and SOCs are designed to mate with emerging wide interface memory devices. Thus, the testing described herein provides an AC margining solution for wide interface devices without having to probe the devices for a direct contact testing approach.

In one example, consider a WIO2 memory device. WIO2 DRAMs (dynamic random access memory) include eight channels. Each of the eight channels has four data signal groups and one command/address (CA) signal group, for a total of 40 signal groups per device. Again, the groups are divided in that each data signal group and the CA signal group are a group of signals that share a common clock signal(s). In addition to the number of signals in a WIO2 device, modern processing techniques can process hundreds or thousands of circuit die on the same semiconductor wafer. Thus, HVM techniques would indicate that hundreds of DRAM devices should be concurrently tested. Proper eye width testing may require dozens or thousands of test data bits. As provided herein, each signal tests for proper receipt of a test bit, and a signal group accumulates pass/fail information for all signal lines of the group. Thus, a test source or test system can interrogate the pass/fail results of each signal group (or other circuit device) only once after the series of test iterations is complete, instead of querying after each iteration.

FIG. 1 is a block diagram of an embodiment of a system that provides indirect I/O testing of a wide interface by use of signal line groups. System 100 includes one or multiple memory devices 110 that have wide I/O interfaces. The I/O interface of memory device 110 can include a number of signal lines that can be organized as multiple signal groups 120. System 100 can test the I/O interface of memory device 110 via signal groups 120 by accumulating pass/fail information for the entire signal group. It will be understood that while system 100 is shown to include memory devices 110, system 100 could alternatively have different devices. In one embodiment, memory devices or other circuit devices 110 are individual circuit die. In one embodiment, the circuit devices can be tested while still together as a semiconductor wafer (e.g., before being separated and packaged).

In one embodiment, system 100 concurrently measures a valid I/O timing eye margin on a signal group basis. The testing can provide the ability to concurrently measure the I/O performance of all signal groups with minimal per signal group overhead by manufacturing automatic test equipment (ATE). In one embodiment, all devices under test (e.g., all DRAM die or other devices) contacted in one wafer prober stepping (e.g., 128 die at a time) can be tested concurrently.

In one embodiment, controller 130 represents the test equipment or test system. The test system can be understood as the test data source. In one embodiment, controller 130 includes logic to execute the I/O testing. Controller 130 also includes hardware to interconnect to devices 110. In one embodiment, each device 110 includes a small number (on the order of a few dozen) of signal pins that can be directly connected to the test system to indirectly test all I/O signal lines in the device. Such test pins can be spaced sufficiently to allow probing or direct contact to such pins, and the signals can then be provided to the I/O buffers in the device under test.

In one embodiment, controller 130 includes settings 132, which provides timing settings for I/O with devices 110 to be used during the testing. As mentioned above, by changing the I/O timing parameters, system 100 can determine the eye size for I/O. Settings 132 enables controller 130 to provide test data with different timing parameters. In one embodiment, settings 132 include settings for two clock or timing signals, TxClk and RxClk. TxClk can be referred as a launch clock, and RxClk can be referred to a capture clock. In one embodiment, settings 132 set the timing between TxClk and RxClk, or the skew positions of one clock signal relative to the other. Controller 130 then provides the clocks to the devices under test.

Controller 130 includes signal generator 134, which generates test data to provide to the one or more devices 110 under test. Signal generator 134 can generate a sequence of test data, which includes particular bits or bit patterns to test the I/O performance of the signal lines being tested. The test data sequence can be dozens of bits long, or thousands of bits long. In one embodiment, controller 130 sends the same test data sequence pattern each time over multiple test iterations, where each test iteration tests different timing settings 132. In one embodiment, controller 130 sends only a single query at the end of each test iteration to receive a pass/fail indication or pass/fail result from each signal group and/or from each device. While each signal group 120 is shown in system 100 providing a pass/fail signal to controller 130, it will be understood that such a signal could be further aggregated at memory device 110 (e.g., each device makes a composite result of all its signal groups 120) and sent to controller 130.

In one embodiment, controller 130 includes clock 136, which is a clock or strobe signal generated by controller 130 as a reference for data generated by signal generator 134. Clock signal 136 is shown going to the signal lines to indicate that the clock and data signals are sent together, and the clock signal is used to capture the data signal. In a common clock implementation, all devices (including controller 130 and memory devices 110) operate from the same clock signal, and all I/O between the memory devices and the controller will be in reference to the common clock. System 100 illustrates one embodiment where controller uses a forwarded or source synchronous clock for I/O, instead of relying solely on a common clock. Thus, memory devices 110 can sample data from signal generator 134 with reference to clock signal 136 and otherwise operate with reference to a common clock signal (not shown). Other implementations can be made without clock 136, relying on a common clock for I/O between controller 130 and memory devices 110.

It will be understood that the clock signals provided by controller 130 or the ATE to devices 110 under test are expected to have inherent edge placement accuracy errors. In one embodiment, timing edge placement accuracy of the TxClk or RxClk is not a relevant factor to the performance of the loopback test circuit when the test data sequence is based on scanning the skew between the two clocks over multiple iterations to measure the valid data eye size. The placement accuracy errors can thus be irrelevant to the testing, seeing that the testing can still accurately measure the width of the signal group data valid eye for each signal group 120 instead of a specific timing placement. Similarly, it will be understood that the clock or timing signals can also be distributed to other signal groups 120, and other devices 110 without concern for matching the flight time of the two clocks. In one embodiment, flight time matching is also not relevant to the accuracy of the testing because each signal group individually scans the data valid eye width using the clocks it receives, and specifically the timing between the clocks. Thus, eye placement relative times will vary because of clock distribution skew errors, but the measured widths can be unaffected at each signal line and each group.

In one embodiment, TxClk edge placement is held constant, and RxClk edge placement resolution is monitored in system 100 by controller 130 in the testing. Edge placement resolution refers to a step size of the difference in skew provided by settings 132 from one test iteration to another. Coarse RxClk edge placement step size limits resolution of the eye width measurement. Finer resolution step size leads to more test iterations and longer test time, but improves the precision of the eye width measurement. For some devices 110, relatively course resolution may provide a sufficient eye width measurement. For other devices (such as certain DRAMs), devices 110 may have a small performance margin requiring a finer resolution. Thus, certain systems can measure the eye width size margin with, for example, 8 different skew settings, while other systems can measure with 16 or more different skew settings. Clock jitter can also reduce the measured data valid eye width. Jitter sources include jitter in the clocks delivered from controller 130 to devices 110, and jitter added in the internal routing within devices 110. Proper test circuit design and device layout can reduce the jitter.

In one embodiment, devices 110 simply report the number of errors detected during a testing sequence or test iteration. Controller 130 can then determine whether the result provided by the group or the device indicates a pass or a fail of the testing. In one embodiment, controller 130 initiates the testing with a skew setting that is expected to be smaller than what a normal device should receive, and extends the skew setting to an eye width wider than what a normal device should require to receive the signal properly. It will be understood that determinations of what eye width is narrower or wider than normal operation can be based both on observation of the devices as well as based on simulations or predictions. In one embodiment, the determinations of proper performance of the devices in testing is based at least in part on statistical variation of a particular device 110 compared to similar testing for all devices having the same I/O interface.

Thus, the test system can include at least an upper threshold that indicates a maximum number of errors considered acceptable for devices 110. It will be understood that the specific threshold will depend on device characteristics, communication protocol, and resolution of the settings used. In one embodiment, the test system also includes a minimum threshold that indicates a minimum and a maximum number of different skew settings when device should detect no errors, based on expected performance. Again, such a threshold would depend on device characteristics, communication protocol, channel characteristics, and resolution of the settings used. Any number of errors detected outside the desired range can indicate a likelihood of failure of the device with respect to I/O performance.

Figure 2:
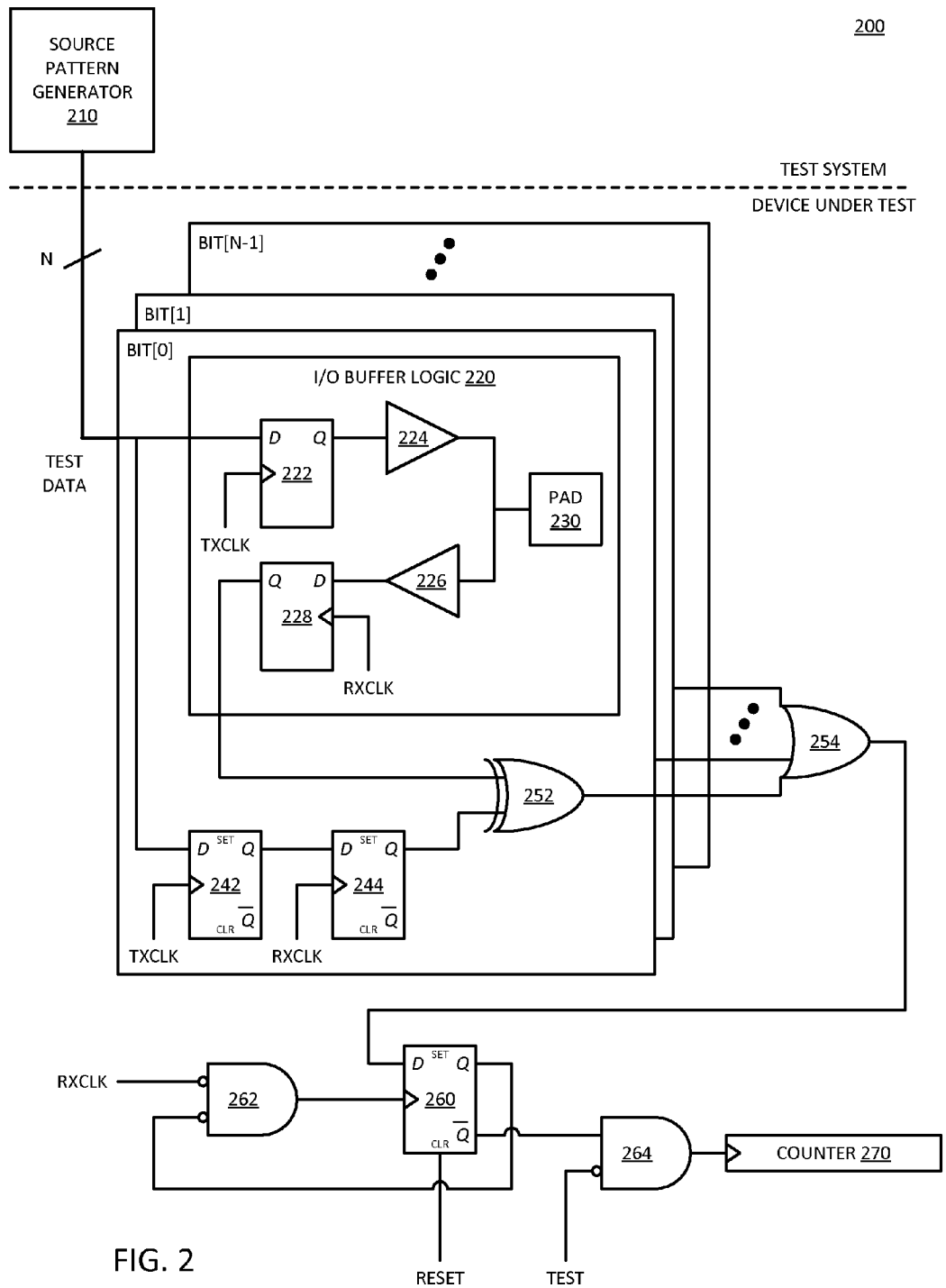
FIG. 2 is a block diagram of an embodiment of a system having individual signal line error detection and signal line group error detection.

FIG. 2 is a block diagram of an embodiment of a system having individual signal line error detection and signal line group error detection. System 200 represents a signal group that receives a test signal from a test system. System 200 can be one example of elements of system 100 of FIG. 1. The testing in system 200 is based on an assumption that most defects that cause an AC timing margin loss can be measured with a linked driver/receiver loopback connection. It will be understood that such an assumption may not be valid for all devices under test. Thus, system 200 illustrates certain specific examples which are not necessarily present in every system implementation. As disclosed above, the basic configuration of the testing is for the system to include an error detection mechanism for each individual I/O buffer (signal line) and for each signal line group to have an associated group error detection mechanism to report back accumulated results. It will be understood that the specific error detection logic represented in system 200 can be replaced by other detection logic.

In one embodiment, the test system triggers a test mode, and the circuit device under test that includes Bit[0] through Bit[N−1] enters a test mode in response to the trigger. In one embodiment, part of entering the test mode includes resetting counters and/or other test components. Source pattern generator 210 is a test source that generates test data. In one embodiment, the test data can be referred to as a test data word, which refers to the pattern or sequence of test data bits to be applied to the I/O for testing. In one embodiment, the test data includes an output from an LSFR (linear feedback shift register) to create a test pattern. The source pattern can be a bit stream per I/O suitable for Bit Error Rate testing. Thus, source pattern generator 210 can generate different pattern types to exercise various stress tests. In one embodiment, the test system also generates launch (TxClk) and capture (RxClk) clocks to provide to the device under test. In one embodiment, the clock signals are distributed and routed from the test system to the respective signal groups and circuit components with consideration of tightly controlled skew of each clock to all bits within the signal group (e.g., via a clock tree), but without consideration of tightly controlled skew or flight time between the two clocks as presented to other signal groups.

In one embodiment, the test system will generate multiple test iterations to measure a valid eye width, and thus will iterate through various different I/O timing settings. A test iteration refers to a few or many cycles of data words or a test sequence sent to and received by a signal group using a given timing setting. For example, the timing setting can include a given skew setting between TxClk and RxClk. For each test iteration, the test system can set the particular timing setting and reset error tracking components (described in more detail below). In one embodiment, all signals in the signal group must correctly receive the data for all cycles of the test iteration to be considered to have passed for that test iteration.

The device under test is shown to have N bits or N pins in the signal group detailed in system 200. N can be any number of signal lines that share a clock signal. It will be understood that the clock signal shared by the signal group may not be the TxClk or RxClk generated by the test equipment, but will be over the same clock lines, and refers to a clock or timing signal used on the device to operate the signal lines. In one embodiment, not every signal group within an interface has the same number of signal lines. For example, the interface of the device under test of which the illustrated signal group is a part can have a signal group that has N+M bits, or N-M bits, where M is some other integer smaller than N. In an implementation where two signal groups of the same interface have different numbers of bits, the system may distribute the appropriate number of signals from generator 210 to match the number of bits in the signal group.

In one embodiment, each of the bits of the signal group is associated with an I/O buffer, shown by I/O buffer logic 220. In one embodiment, buffer 220 is a standard I/O buffer, meaning that there are not necessarily any changes needed to the I/O buffer logic to perform the testing described herein. System 200 illustrates one example of logic for buffer 220. As shown, buffer 220 receives the test signal at transmit latch 222, and buffers the signal from the output of latch 222 with amplifier 224 to pad 230. Pad 230 could alternatively be referred to as a pin or other hardware element that interfaces internal logic with an external device over a signal line. As configured in the test mode, buffer 220 can be in a loopback configuration, where pad 230 provides the bit received as an output, by sending the bit through amplifier 226 to receive latch 228. As illustrated, TxClk triggers the operation of latch 222, and RxClk triggers the operation of latch 228. In one embodiment, each new cycle or bit of the test data is launched with a rising edge of TxClk rising edge, and data capture for that bit is triggered with a rising edge of RxClk. As illustrated, system 200 can be implemented with a single cycle timing requirement between the transmit and receive loopback. In one embodiment, the loopback path can be extended to be multiple cycles. In an implementation where the loopback is extended to multiple clock cycles, the compare logic can also be extended to have multiple clock stages.

The output of latch 228 for testing can be outputted to XOR gate 252. In one embodiment, the output of latch 228 is compared at XOR gate 252 against the incoming bit as received from generator 210. It will be understood that managing the timing of the comparison at XOR gate 252 is important to getting proper error detection. Latches 242 and 244 can guarantee the timing for the testing to sure the bits read from pad 230 are tested against corresponding incoming bits. As seen, latch 242 is triggered by TxClk to feed its output into the input of latch 244. Latch 244 in turn is triggered by RxClk to feed its output to XOR gate 252, which should guarantee that the right bit is latched into XOR gate 252 to compare against the receiver/driver looped back bit. Each of bits[0] through [N-1] include a similar signal line error detection mechanism to determine if each specific I/O buffer received the test data bit correctly. The XOR gates of all signal lines feed into OR gate 254. Thus, any error on any signal line the signal line group should trigger an error at the output of OR gate 254.

In one embodiment, OR gate 254 feeds its output into the input of sticky error latch 260. Latch 260 is a "sticky" latch that records errors because of its configuration. Namely, the noninverted output of latch 260 is fed back into the latch enable via AND gate 262. As long as the output of OR gate 254 is zero, Q will be zero, and AND gate 262 will output a one whenever RxClk goes low. Thus, as long as no error indication is received from OR gate 254, latch 260 will be enabled for the next bit or next receive cycle. As soon as the output of OR gate 254 is a one, indicating an error on one of the signal lines of the group, the output Q from latch 260 will hold the latch disabled via AND gate 262.

It will be observed that the inverting output (/Q) of latch 260 is fed into a noninverting input of AND gate 264. The output /Q is ANDed with an inverted Test signal. The Test signal can be a signal set by the test system for each iteration of the test, and held high for the length of the test cycle/iteration. Thus, AND gate 264 can only generate a one at its output if the Test signal is low, and /Q is high, meaning D is a zero. D will only remain a zero as long as no test bit triggers an error. Thus, in one embodiment, counter 270 counts only passing cycles, or entire test iterations. If any bit fails on any signal line, counter 270 is not incremented for that test iteration. Thus, the passing eye is a composite of all bits within a window, distributed across all pins in the interface, and can be distributed across multiple interfaces. In one embodiment, each different signal group keeps track of the number of passing and/or failing test iterations (e.g., via counter 270 or equivalent).

In one embodiment, counter 270 can count passes or fails for an entire test iteration, for a specific I/O timing setting. Thus, counter 270 can monitor passing iterations over all different timing settings and accumulate pass/fail information for the entire signal group. Counter 270 can be configured to monitor either passing iterations or failing iterations, or a mechanism can be included to track both. In one embodiment, after the desired number of test iterations, the test system receives a pass/fail result from the device under test. For example, the test system can read counter 270, which can be a passing iteration counter value. In one embodiment, the test system checks the counter value against an empirically determined defect free minimum passing count value and/or a maximum count value. The test system can access counter 270 via register reads/writes, by scan chain, or other means.

In one embodiment, rather than interrogating the device under test on each iteration, the device under test can accumulate pass/fail information and the test system can query the device under test for values after all test iterations. The expression accumulating pass/fail information can refer to monitoring a number of passing iterations as described and/or to monitoring a number of failing iterations. The value of the counter can be used by the test system to determine whether the device under test passed overall for the entire test, or failed for the test as a whole, based on the count provided.

Figure 3:
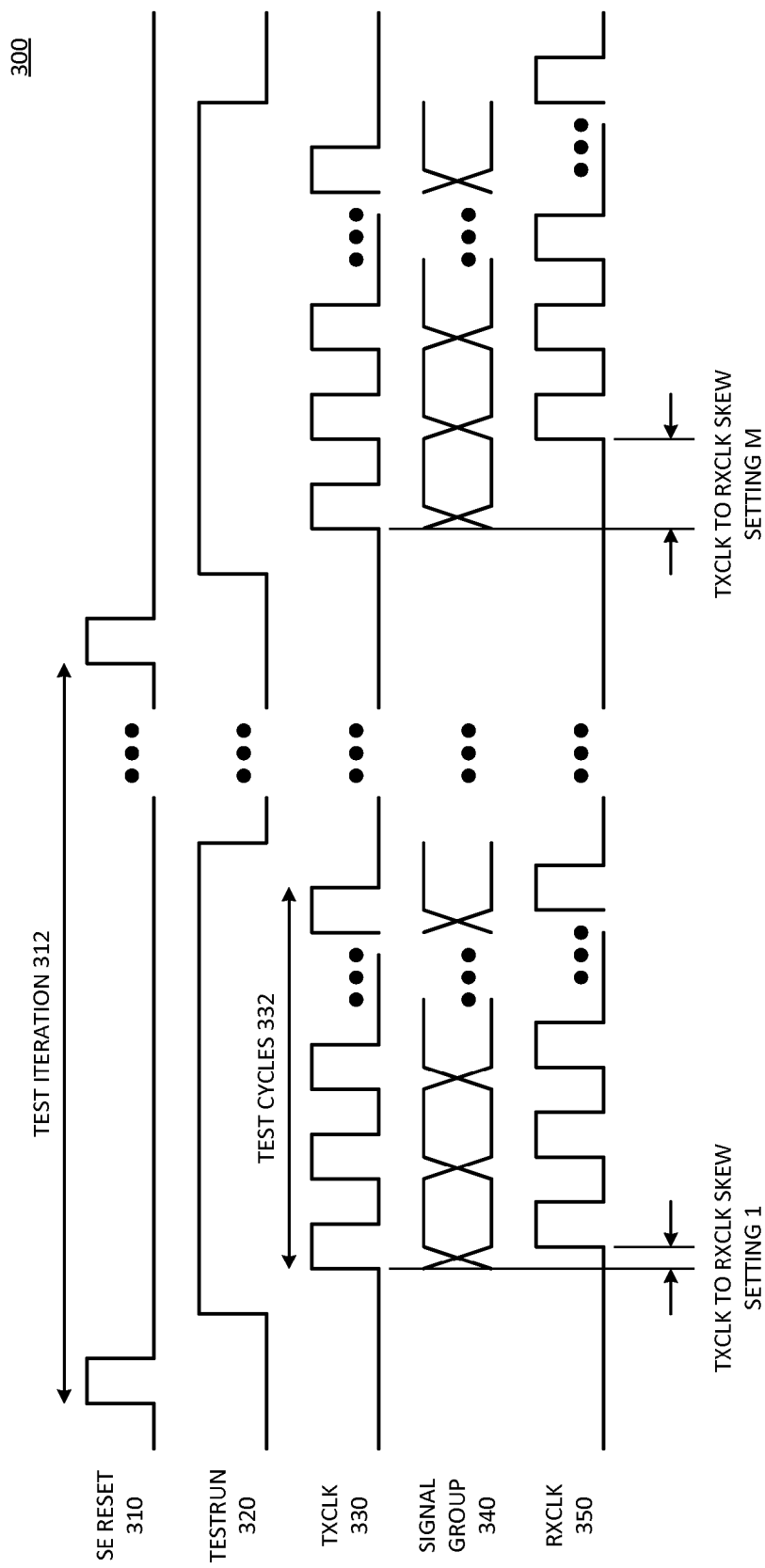
FIG. 3 is a timing diagram of an embodiment of a representation of indirect I/O interface testing with different timing settings.

FIG. 3 is a timing diagram of an embodiment of a representation of indirect I/O interface testing with different timing settings. Diagram 300 can be one example of timing for signals in accordance with system 100 and/or system 200. Diagram 300 illustrates relative timing for SE Reset 310, TestRun 320, TxClk 330, Signal Group 340, and RxClk 350.

In one embodiment, the test system triggers a sticky error latch (SE) reset for each test iteration 312. Test iteration 312 can be considered to span an entire cycle of test data or a data word. In one embodiment, there will be M total iterations 312, as indicated by the M different skew settings. The test data is executed for test cycle 332, which is a number of cycles of data sent to the device(s) under test, as shown by TxClk 330. Each test data bit in the test data sequence is sent in a test cycle 332, one per cycle. Data group 340 illustrates the data signal generated at the I/O buffer for the testing.

The test system can set TestRun signal 320 after resetting the error latch. The test system can keep TestRun 320 set for a number of bytes of test data to be sent to the device under test. Thus, TestRun 320 can be active for all of test cycles 332, which the test system may not send until TestRun 320 is active. In one embodiment, when TestRun 320 goes low, it triggers the test system to determine whether to query the device under test for pass/fail information. In one embodiment, only after M falling edges on TestRun 320 will the test system query the device under test for pass/fail information. In one embodiment, each falling edge of TestRun 320 triggers the counter to record a test iteration as passing or failing (e.g., similar to what is shown with gate 264 of system 200).

Diagram 300 illustrates different levels of skew or offset between TxClk and RxClk. Thus, in one embodiment, the timing setting includes a skew setting between the transmit clock and the receive clock. In one embodiment, the timing and placement of TxClk is fixed in the test system, and the placement of RxClk with respect to TxClk is controlled. Alternative system configurations can control the timing of TxClk with respect to RxClk, and/or introduce other timing setting changes to affect the eye width. In each iteration, the test system can generate a different skew setting, as illustrated in diagram 300. Skew setting 1 can be considered a first iteration 312, and skew setting M can be considered a last iteration 312 of the testing. It will be observed how skew setting M is different than skew setting 1, and namely, it is significantly larger. In one embodiment, the test system starts with a larger skew setting and decreases the skew for each test iteration 312. M can be 4, 8, 12, 20, 32, or some other value, indicating a number of different skew settings that can be used with a corresponding number of iterations. However, it will be understood that one or more (e.g., all) skew settings could be iterated multiple times during testing. Thus, there could be M skew settings tested over 2M test iterations 312.

Figure 4:
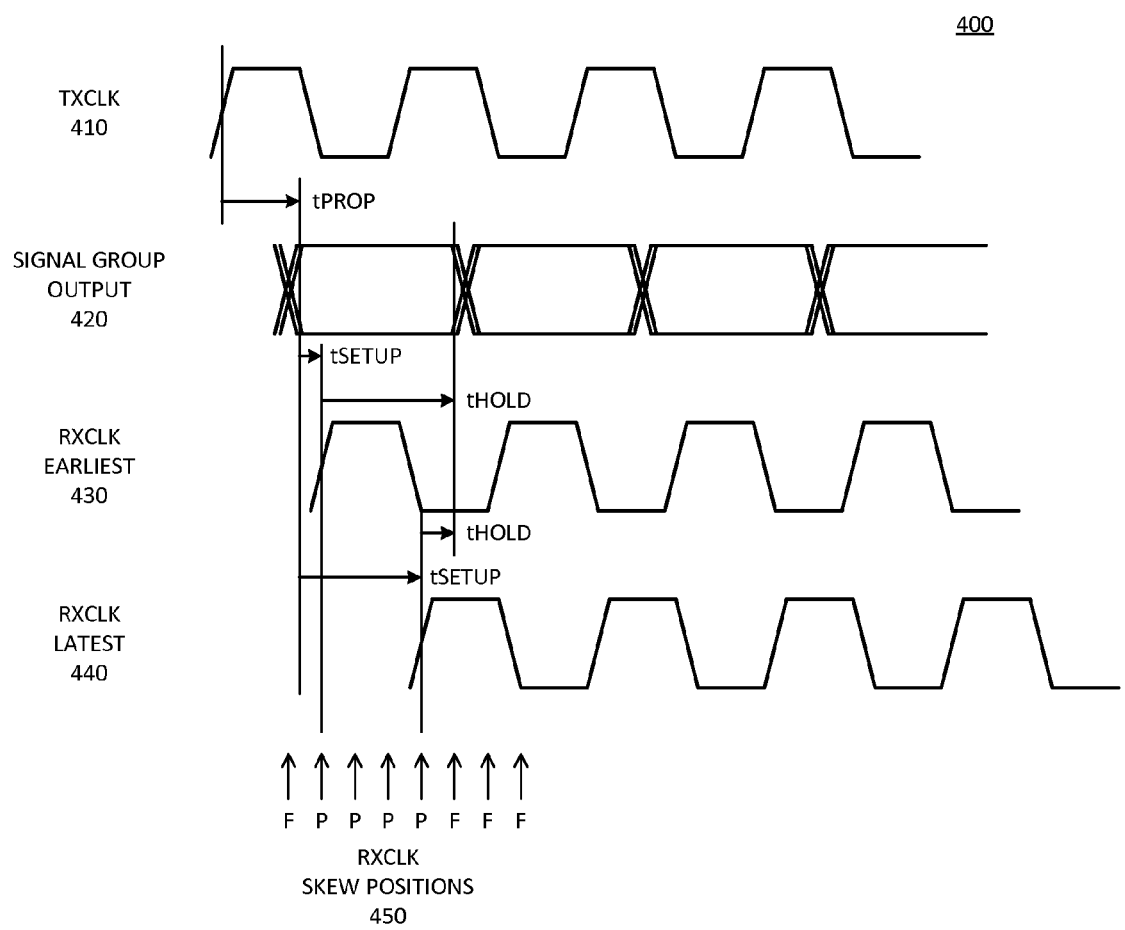
FIG. 4 is a timing diagram of an embodiment of a representation of passing and failing skew settings.

FIG. 4 is a timing diagram of an embodiment of a representation of passing and failing skew settings. Diagram 400 can be one example of timing for signals in accordance with system 100 and/or system 200. Diagram 400 illustrates relative timing for TxClk 410, signal group output 420, the earliest passing RxClk 430 and the latest passing RxClk 440. Diagram 400 also illustrates an example of the passes and failures for a signal group based on different skew positions 450.

The test system sends data based on TxClk 410. In one embodiment, the test source of the test system triggers the test data on the rising edge of TxClk 410. Propagation delay (tProp) represents an unknown (and unmeasurable) delay from a rising edge of TxClk 410 that results in the signal group generating an output. Propagation delay is a function of the path over which the signals will be distributed. Thus, tProp will be different for different signal groups. The system will also apply an RxClk with an unknown phase relationship to TxClk 410 when it arrives at the circuit or device under test. By testing various different skew or phase timing differences between RxClk and TxClk 410, the system can count a number of passing iterations (e.g., with a counter as in FIG. 2) and thus measure the size of the passing window between TxClk 410 and RxClk 430, 440. Thus, regardless of the flight time differences of TxClk 410 and RxClk 430, 440, the system can measure the eye width by testing RxClk at various points over the clock period.

Signal group output 420 represents the data signal at the pad of the I/O buffer. The delay tProp from the TxClk rising edge indicates the time until the test signal is seen at the I/O buffer. The delay tSetup represents the time from when the data is seen at the I/O buffer until the rising edge of RxClk. The delay tHold is the time between the rising edge of RxClk and the end of the data signal (signal group output 420). It will be understood that a receive device (such as a receive flip flop), will require a certain minimum time tSetup+tHold to capture the data. The skew position changes refer to the changes in the rising edge of the RxClk as the relative phase between the RxClk and the TxClk is adjusted. It will be observed that with RxClk 430, the time tSetup is relatively short. The time tSetup is longer with RxClk 440. Thus, the time before the data is sampled is longer for later skew positions 450, but there is a corresponding decrease in tHold. The system will register a pass when the minimum tSetup+tHold is met, and will register a fail when the minimum tSetup+tHold is violated.

As seen from the different RxClk skew positions 450, each arrow represents a position of the rising edge of RxClk. It will be understood that RxClk earliest 430 and RxClk latest 440 represent the earliest and latest, respectively, passing skew positions for RxClk. Skew positions 450 are each indicated by an arrow with a 'P' for a passing position, or an 'F' for a failing position. As illustrated, there are four passing skew positions. Consider that four passes indicates a "normal" device. In such a case, only 2 or 3 counts likely indicates a problem with the device. Likewise, 6 or 7 counts likely also indicates a problem with the device. 5 counts may indicate a passing device, but may not clearly indicate whether the device has a problem or not. It will be understood that sixteen counts instead of eight offers better resolution. In one embodiment, a statistical approach can be used to identify passing devices. For example, the statistical distribution of devices can indicate what devices should be considered passing and which should be considered failing. The test system can determine based on a count returned by the signal group whether the device passes the test.

Thus, the testing can identify apparently normal versus defective I/Os if the composite eye of the signal group is abnormally small. The beginning of the valid eye is determined by the transmit path propagation delay in the transmit flip-flop and transmit buffer, plus the receive path propagation delay in the receive buffer, plus the setup time required at the receiving flip-flop. The end of the valid eye is determined by the receive path propagation delay and the receive flip-flop data in hold time. It will be understood that the testing does not necessarily identify whether a defect is in the transmit source side, the interconnect, or the receive capture/compare side of the I/O buffer. Regardless of the cause of the defect, any of the following possible failure modes are expected to be detectable as a reduced valid eye width for the signal group: weak transmit buffer, delay in the transmit side clocking on an individual signal in the signal group, receiver slew rate defects, or receive logic path delays including receive side clocking on an individual signal in a signal group.

Figure 5:
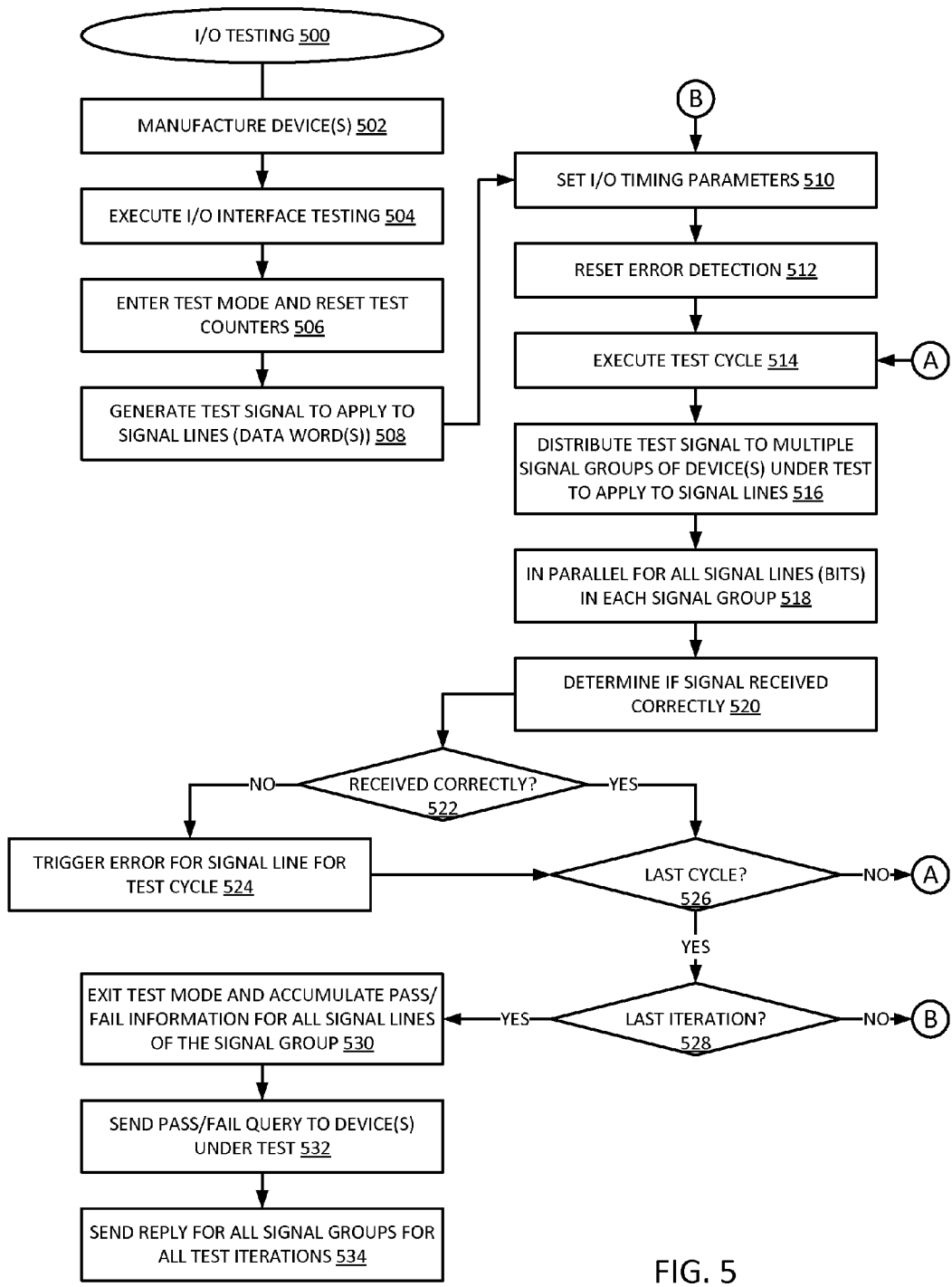
FIG. 5 is a flow diagram of an embodiment of a process for indirect I/O interface testing.

FIG. 5 is a flow diagram of an embodiment of a process for indirect I/O interface testing. A test system performs process 500 for I/O testing on one or more devices at a time, testing the signal lines of a device I/O interface. A manufacturer manufactures devices, 502, and executes I/O interface testing on the devices, 504. The I/O interface testing may be only one of multiple tests that the manufacturer performs.

In one embodiment, the test system enters a test mode and triggers the device under test to enter a test mode, 506. Entering the test mode can include resetting test counters used to track pass/fail information during the testing. The test system generates a test signal to apply to the signal lines of the device under test, 508. The test signal can be one or more data words or a sequence of bits intended to test the function of the I/O buffers/signal lines of the I/O interface.

In one embodiment, the test system sets I/O timing parameters for particular test iteration, 510. The test system can store or save each of the I/O timing parameters as they are tested. In one embodiment, the timing parameters include settings that affect the relative timing or skew between a transmit clock and a receive clock generated by the test system. The test system can initiate each test iteration by resetting error detection on the device under test, such as test loop flip-flops or latches, 512. In one embodiment, the test system executes multiple test iterations and loops through multiple test cycles, 514. There can be one test iteration for each timing parameter setting. There are multiple cycles per iteration, where each cycle provide a test data bit. The test system provides the test signal, which each device under test distributes to one or more signal groups of the I/O interface to apply to the signal lines of the interface, 516.

In parallel for all signal lines or bits being tested in each signal group being tested, 518, the local signal line error detection determines for each I/O buffer if the signal bit or signal cycle received correctly, 520. If the signal was not received correctly, 522 NO branch, the local test circuit triggers an error for the signal for the test cycle, 524. The signal group testing approach makes a composite error signal for all signal lines of the group and detects an error for the signal group if any signal line detects an error. If the signal receives correctly, 522 YES branch, no error is detected. The testing continues for all cycles or bits of the test data sequence. Thus, if the last cycle of the test data has not been reached, 526 NO branch, the testing continues back at 512. Thus, if the last cycle of the test data has been reach, 526 YES branch, the testing continues until the last iteration of testing has tested all timing parameter setting. Thus, if the last iteration of testing has not been reached, 528 NO branch, the testing continues back at 510.

If the last iteration of test has been reached, 528 YES branch, the testing system exits test mode and triggers the device(s) under test to also exit test mode, 530. In one embodiment, the signal group can accumulate pass/fail information for the signal group for all test iterations, 530. The pass/fail information can be accumulated in a counter, which the test system can read or query. The test system can generate a pass/fail query to the device(s) under test, 532. Each device under test can reply for all signal groups for all test iterations to allow the test system to determine if the device passes or fails the test, 534. The test system can also read an iteration counter and compare it against an expected count. For example, as stated above, there can be an expected range of passing (or failing if accumulating the negative) counts; a count outside the expected range can indicate a failing device. The test system can report on each device as passing or failing based on the count. In one embodiment, logic on a device die can perform a comparison and report a pass or fail based on the comparison on-die. In one embodiment, the device under test passes the count to the test system, and the test system performs a comparison of the count to an expected count.

Figure 6:
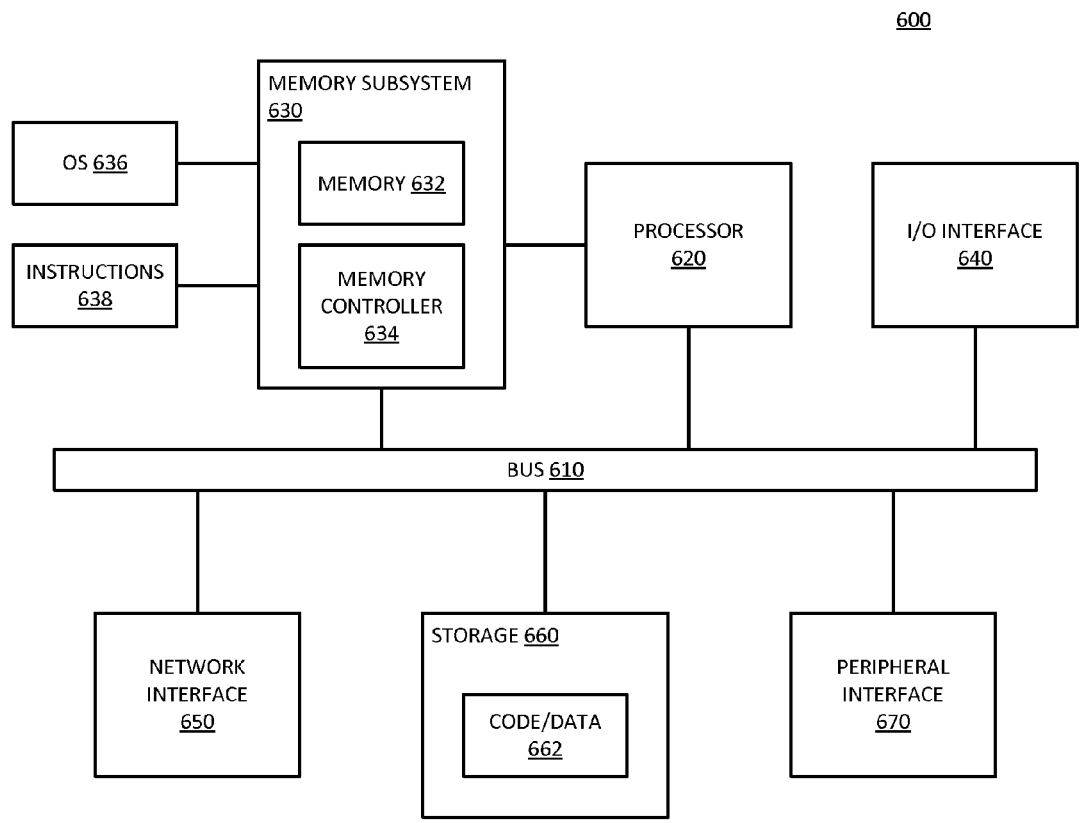
FIG. 6 is a block diagram of an embodiment of a computing system in which indirect I/O interface testing can be implemented.

FIG. 6 is a block diagram of an embodiment of a computing system in which indirect I/O interface testing can be implemented. System 600 represents a computing device in accordance with any embodiment described herein, and can be a laptop computer, a desktop computer, a server, a gaming or entertainment control system, a scanner, copier, printer, routing or switching device, or other electronic device. System 600 includes processor 620, which provides processing, operation management, and execution of instructions for system 600. Processor 620 can include any type of microprocessor, central processing unit (CPU), processing core, or other processing hardware to provide processing for system 600. Processor 620 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 630 represents the main memory of system 600, and provides temporary storage for code to be executed by processor 620, or data values to be used in executing a routine. Memory subsystem 630 can include one or more memory devices such as read-only memory (ROM), flash memory, one or more varieties of random access memory (RAM), or other memory devices, or a combination of such devices. Memory subsystem 630 stores and hosts, among other things, operating system (OS) 636 to provide a software platform for execution of instructions in system 600. Additionally, other instructions 638 are stored and executed from memory subsystem 630 to provide the logic and the processing of system 600. OS 636 and instructions 638 are executed by processor 620. Memory subsystem 630 includes memory device 632 where it stores data, instructions, programs, or other items. In one embodiment, memory subsystem includes memory controller 634, which is a memory controller to generate and issue commands to memory device 632. It will be understood that memory controller 634 could be a physical part of processor 620.

Processor 620 and memory subsystem 630 are coupled to bus/bus system 610. Bus 610 is an abstraction that represents any one or more separate physical buses, communication lines/interfaces, and/or point-to-point connections, connected by appropriate bridges, adapters, and/or controllers. Therefore, bus 610 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 610 can also correspond to interfaces in network interface 650.

System 600 also includes one or more input/output (I/O) interface(s) 640, network interface 650, one or more internal mass storage device(s) 660, and peripheral interface 670 coupled to bus 610. I/O interface 640 can include one or more interface components through which a user interacts with system 600 (e.g., video, audio, and/or alphanumeric interfacing). Network interface 650 provides system 600 the ability to communicate with remote devices (e.g., servers, other computing devices) over one or more networks. Network interface 650 can include an Ethernet adapter, wireless interconnection components, USB (universal serial bus), or other wired or wireless standards-based or proprietary interfaces.

Storage 660 can be or include any conventional medium for storing large amounts of data in a nonvolatile manner, such as one or more magnetic, solid state, or optical based disks, or a combination. Storage 660 holds code or instructions and data 662 in a persistent state (i.e., the value is retained despite interruption of power to system 600). Storage 660 can be generically considered to be a "memory," although memory 630 is the executing or operating memory to provide instructions to processor 620. Whereas storage 660 is nonvolatile, memory 630 can include volatile memory (i.e., the value or state of the data is indeterminate if power is interrupted to system 600).

Peripheral interface 670 can include any hardware interface not specifically mentioned above. Peripherals refer generally to devices that connect dependently to system 600. A dependent connection is one where system 600 provides the software and/or hardware platform on which operation executes, and with which a user interacts.

In one embodiment, one or more circuit components of system 600 include wide I/O interfaces. In one embodiment, elements of system 600 are included in an SOC in which one or more wide I/O interfaces are tested in system within system 600. The interface testing includes testing the I/O interface in signal groups, with each signal group accumulating pass/fail information to send to a test system (not shown). The test system can then determine if the components tested pass or fail the testing.

Figure 7:
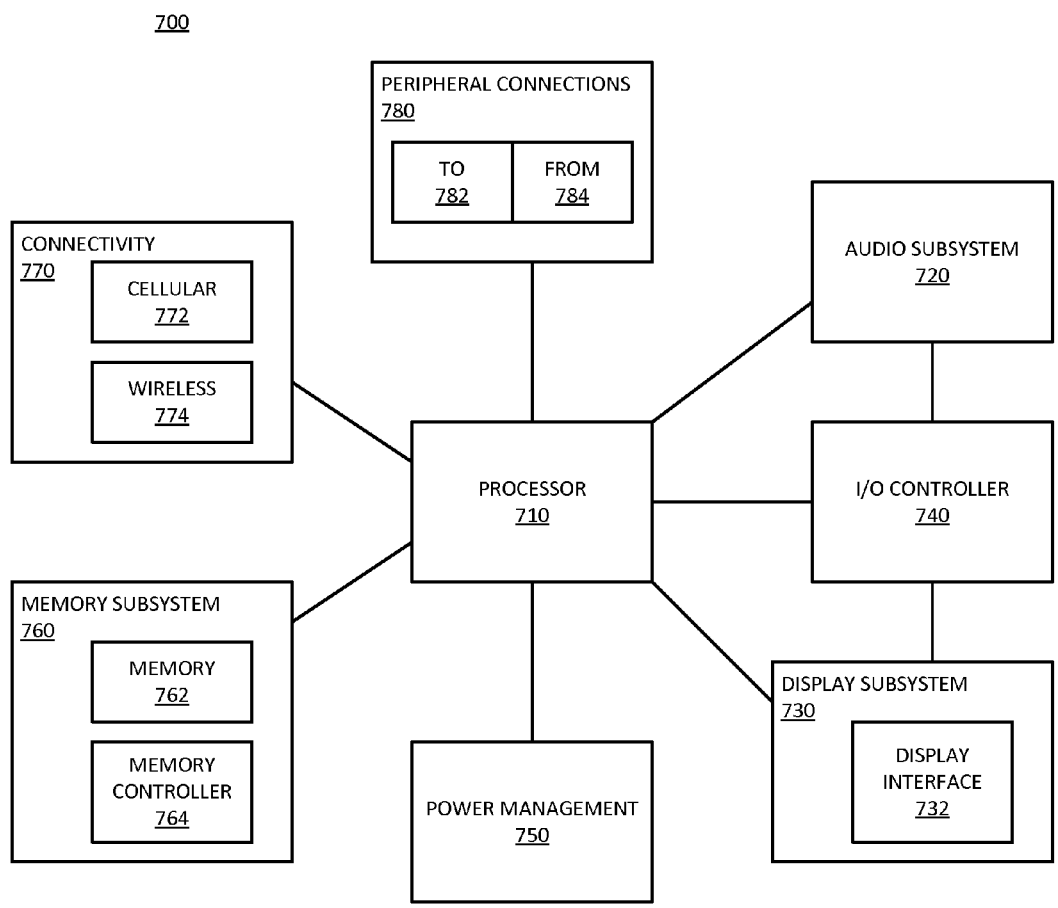
FIG. 7 is a block diagram of an embodiment of a mobile device in which indirect I/O interface testing can be implemented.

FIG. 7 is a block diagram of an embodiment of a mobile device in which indirect I/O interface testing can be implemented. Device 700 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 700.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting device 700 to another device. The processing operations can also include operations related to audio I/O and/or display I/O.

In one embodiment, device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 700, or connected to device 700. In one embodiment, a user interacts with device 700 by providing audio commands that are received and processed by processor 710.

Display subsystem 730 represents hardware (e.g., display devices) and software (e.g., drivers) components that provide a visual and/or tactile display for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 can operate to manage hardware that is part of audio subsystem 720 and/or display subsystem 730. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, gyroscopes, global positioning system (GPS), or other hardware that can be included in device 700. The input can be part of direct user interaction, as well as providing environmental input to the system to influence its operations (such as filtering for noise, adjusting displays for brightness detection, applying a flash for a camera, or other features). In one embodiment, device 700 includes power management 750 that manages battery power usage, charging of the battery, and features related to power saving operation.

Memory subsystem 760 includes memory device(s) 762 for storing information in device 700. Memory subsystem 760 can include nonvolatile (state does not change if power to the memory device is interrupted) and/or volatile (state is indeterminate if power to the memory device is interrupted) memory devices. Memory 760 can store application data, user data, music, photos, documents, or other data, as well as system data (whether long-term or temporary) related to the execution of the applications and functions of system 700. In one embodiment, memory subsystem 760 includes memory controller 764 (which could also be considered part of the control of system 700, and could potentially be considered part of processor 710). Memory controller 764 includes a scheduler to generate and issue commands to memory device 762.

Connectivity 770 includes hardware devices (e.g., wireless and/or wired connectors and communication hardware) and software components (e.g., drivers, protocol stacks) to enable device 700 to communicate with external devices. The external device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 774 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (e.g., downloading and/or uploading, changing, synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, one or more circuit components of system 700 include wide I/O interfaces. In one embodiment, system 700 is implemented in whole or in part as an SOC in which one or more wide I/O interfaces are tested in system within system 700. The interface testing includes testing the I/O interface in signal groups, with each signal group accumulating pass/fail information to send to a test system (not shown). The test system can then determine if the components tested pass or fail the testing.

In one aspect, a method for testing an I/O (input/output) interface includes receiving a test data sequence at a hardware interface of a device under test; distributing each bit of the test data sequence concurrently to each signal line of a group of multiple signal lines, each signal line interfacing a hardware I/O buffer of the device under test, wherein the multiple signal lines of the group share a common timing signal; detecting an error for any signal line when the signal line does not receive a bit of the test data sequence correctly for a given timing setting; accumulating pass/fail data for all signal lines of the group based on the detected errors; and sending an pass/fail indication value to the test source only after accumulating pass/fail information for all bits of the test data sequence.

In one embodiment, distributing the bits of the test data sequence to the group comprises distributing the bits of the test data sequence to multiple different groups of a common I/O interface channel. In one embodiment, distributing the test data sequence further comprises distributing the test data sequence to multiple different devices in parallel, each device including one or more groups. In one embodiment, detecting the error for any signal line comprises setting a sticky error latch for the signal group when it receives any of the bits incorrectly. In one embodiment, the timing setting comprises a skew between a transmit clock and a receive clock. In one embodiment, accumulating pass/fail data comprises tracking a total number of passing iterations with a counter. In one embodiment, the method further comprising determining that the device under test fails when the pass/fail indication indicates a number of errors within a target range of values. In one embodiment, the target range of errors is based on a statistical variation of testing from devices having the I/O interface. In one embodiment, the method further comprising repeating the distributing, detecting, accumulating, and sending for multiple different timing settings prior to the determining. In one embodiment, the accumulating comprises accumulating for all timing settings, and wherein sending pass/fail indication to the test source comprises sending the pass/fail indication only after accumulating pass/fail data for all bits of the test data sequence for all timing settings.

In one aspect, a circuit device having an I/O (input/output) interface includes: a group of multiple signal lines that each interfaces to a hardware I/O buffer of the I/O interface wherein the multiple signal lines of each group share a common timing signal, wherein each of the signal lines is to receive bits of a test data sequence distributed to the group from a test source; multiple error detection circuits, wherein each signal line of the group has an associated error detection circuit to detect an error for the signal line if any of the bits of the test data sequence are not received correctly by the I/O buffer for a given timing setting; and a group detection circuit coupled to receive error detection indications from the multiple error detection circuits, the group detection circuit to accumulate pass/fail information detected for all signal lines of the group and send an error value to the test source only after errors for all bits of the test data sequence are accumulated.

In one embodiment, the I/O interface comprises an interface of a wide interface memory device. In one embodiment, the group is one of multiple groups of the circuit device, wherein each group includes multiple circuit lines, multiple error detection circuits, and a group detection circuit. In one embodiment, the group is one of multiple groups of one of multiple different devices in parallel, each device include one or more groups. In one embodiment, the error detection circuits include a sticky error latch, which is set when the signal line does not receive the test data sequence correctly for any bit of the test data sequence. In one embodiment, the timing setting comprises a skew between a transmit clock and a receive clock. In one embodiment, the group detection circuit further comprises a counter to accumulate a passing count. In one embodiment, the group detection circuit further comprises a counter to accumulate a failing count. In one embodiment, the group detection circuit is to determine that the device under test fails when the pass/fail information indicates a number of errors within a target range of values. In one embodiment, the group detection circuit is to compare the number of errors to a target range of errors based on a statistical variation of testing from devices having the I/O interface. In one embodiment, the group detection circuit is to accumulate pass/fail information for multiple different timing settings.

In one aspect, a system including a circuit device having an I/O (input/output) interface, includes: a test source to generate a test data sequence; a semiconductor wafer having multiple distinct circuit die processed in the wafer, each circuit die including a group of multiple signal lines that each interfaces to a hardware I/O buffer of an I/O interface of the circuit die wherein the multiple signal lines of each group share a common timing signal, wherein each of the signal lines is to receive bits of the test data sequence distributed to the group from the test source; multiple error detection circuits, wherein each signal line of the group has an associated error detection circuit to detect an error for the signal line if any of the bits of the test data sequence are not received correctly by the I/O buffer for a given timing setting; and a group detection circuit coupled to receive error detection indications from the multiple error detection circuits, the group detection circuit to accumulate pass/fail information detected for all signal lines of the group and send an error value to the test source only after errors for all bits of the test data sequence are accumulated; wherein the test data sequence is distributed to signal line groups on multiple circuit die on the semiconductor wafer to concurrently, indirectly test the I/O interface of the multiple circuit die.

In one embodiment, the I/O interface comprises an interface of a wide interface memory device. In one embodiment, the group is one of multiple groups of the circuit device, wherein each group includes multiple circuit lines, multiple error detection circuits, and a group detection circuit. In one embodiment, the group is one of multiple groups of one of multiple different devices in parallel, each device include one or more groups. In one embodiment, the error detection circuits include a sticky error latch, which is set when the signal line does not receive the test data sequence correctly for any bit of the test data sequence. In one embodiment, the timing setting comprises a skew between a transmit clock and a receive clock. In one embodiment, the group detection circuit further comprises a counter to accumulate a passing count. In one embodiment, the group detection circuit further comprises a counter to accumulate a failing count. In one embodiment, the group detection circuit is further to determine that the device under test fails when the pass/fail information indicates a number of errors within a target range of values. In one embodiment, the group detection circuit is to compare the number of errors to a target range of errors based on a statistical variation of testing from devices having the I/O interface. In one embodiment, the group detection circuit is to accumulate pass/fail information for multiple different timing settings. In one embodiment, the test source is further to determine that the device under test fails when the pass/fail information indicates a number of errors within a target range of values. In one embodiment, the test source is to compare the number of errors to a target range of errors based on a statistical variation of testing from devices having the I/O interface. In one embodiment, the group detection circuit is to accumulate pass/fail information for multiple different timing settings prior to sending the pass/fail information to the test source.

In one aspect, an article of manufacture comprises a computer readable storage medium having content stored thereon, which when executed performs operations for testing an I/O (input/output) interface, including: receiving a test data sequence at a hardware interface of a device under test; distributing each bit of the test data sequence concurrently to each signal line of a group of multiple signal lines, each signal line interfacing a hardware I/O buffer of the device under test, wherein the multiple signal lines of the group share a common timing signal; detecting an error for any signal line when the signal line does not receive a bit of the test data sequence correctly for a given timing setting; accumulating pass/fail data for all signal lines of the group based on the detected errors; and sending an pass/fail indication value to the test source only after accumulating pass/fail information for all bits of the test data sequence.

In one embodiment, the content for distributing the bits of the test data sequence to the group comprises content for distributing the bits of the test data sequence to multiple different groups of a common I/O interface channel. In one embodiment, the content for distributing the test data sequence further comprises content for distributing the test data sequence to multiple different devices in parallel, each device including one or more groups. In one embodiment, the content for detecting the error for any signal line comprises content for setting a sticky error latch for the signal group when it receives any of the bits incorrectly. In one embodiment, the timing setting comprises a skew between a transmit clock and a receive clock. In one embodiment, the content for accumulating pass/fail data comprises content for tracking a total number of passing iterations with a counter. In one embodiment, further comprising content for determining that the device under test fails when the pass/fail indication indicates a number of errors within a target range of values. In one embodiment, the target range of errors is based on a statistical variation of testing from devices having the I/O interface. In one embodiment, further comprising content for repeating the distributing, detecting, accumulating, and sending for multiple different timing settings prior to the determining. In one embodiment, the content for accumulating comprises content for accumulating for all timing settings, and wherein the content for sending pass/fail indication to the test source comprises content for sending the pass/fail indication only after accumulating pass/fail data for all bits of the test data sequence for all timing settings.

In one aspect, an apparatus for testing an I/O (input/output) interface includes: means for receiving a test data sequence at a hardware interface of a device under test; means for distributing each bit of the test data sequence concurrently to each signal line of a group of multiple signal lines, each signal line interfacing a hardware I/O buffer of the device under test, wherein the multiple signal lines of the group share a common timing signal; means for detecting an error for any signal line when the signal line does not receive a bit of the test data sequence correctly for a given timing setting; means for accumulating pass/fail data for all signal lines of the group based on the detected errors; and means for sending an pass/fail indication value to the test source only after accumulating pass/fail information for all bits of the test data sequence.

In one embodiment, the means for distributing the bits of the test data sequence to the group comprises means for distributing the bits of the test data sequence to multiple different groups of a common I/O interface channel. In one embodiment, the means for distributing the test data sequence further comprises means for distributing the test data sequence to multiple different devices in parallel, each device including one or more groups. In one embodiment, the means for detecting the error for any signal line comprises means for setting a sticky error latch for the signal group when it receives any of the bits incorrectly. In one embodiment, the timing setting comprises a skew between a transmit clock and a receive clock. In one embodiment, the means for accumulating pass/fail data comprises means for tracking a total number of passing iterations with a counter. In one embodiment, further comprising means for determining that the device under test fails when the pass/fail indication indicates a number of errors within a target range of values. In one embodiment, the target range of errors is based on a statistical variation of testing from devices having the I/O interface. In one embodiment, further comprising means for repeating the distributing, detecting, accumulating, and sending for multiple different timing settings prior to the determining. In one embodiment, the means for accumulating comprises means for accumulating for all timing settings, and wherein the means for sending pass/fail indication to the test source comprises means for sending the pass/fail indication only after accumulating pass/fail data for all bits of the test data sequence for all timing settings.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for testing an I/O (input/output) interface, comprising:
   receiving a test data sequence at a hardware interface of a device under test from a test source separate from the device under test;
   distributing each bit of the test data sequence concurrently to each signal line of a group of multiple signal lines, each signal line interfacing a hardware I/O buffer of the device under test, wherein the multiple signal lines of the group share a common timing signal;
   testing for errors at each hardware I/O buffer, including detecting an error for any signal line when the signal line does not receive a bit of the test data sequence correctly for a given timing setting;
   accumulating pass/fail data for all signal lines of the group at the device under test based on the detected errors; and
   sending a pass/fail indication value to the test source from the device under test only after accumulating pass/fail information for all bits of the test data sequence for all the signal lines of the group.

2. The method of claim 1, wherein the group of multiple signal lines comprises one of multiple different groups of multiple signal lines, and wherein distributing the bits of the test data sequence to the group comprises distributing the bits of the test data sequence to the multiple different groups of a common I/O interface channel.

3. The method of claim 1, wherein distributing the test data sequence further comprises distributing the test data sequence to multiple different devices in parallel, each device including one or more groups.

4. The method of claim 1, wherein detecting the error for any signal line comprises setting a sticky error latch for the entire signal group when it receives any of the bits incorrectly.

5. The method of claim 1, wherein the timing setting comprises a skew between a transmit clock and a receive clock.

6. The method of claim 1, wherein accumulating pass/fail data comprises tracking a total number of passing iterations with a counter.

7. The method of claim 1, further comprising determining that the device under test fails when the pass/fail indication indicates a number of errors within a target range of values.

8. The method of claim 7, wherein the target range of errors is based on a statistical variation of testing from devices having the I/O interface.

9. The method of claim 7, further comprising repeating the distributing, detecting, accumulating, and sending for multiple different timing settings prior to the determining.

10. The method of claim 9, wherein the accumulating comprises accumulating for all timing settings, and wherein sending pass/fail indication to the test source comprises sending the pass/fail indication only after accumulating pass/fail data for all bits of the test data sequence for all the signal lines of the group for all timing settings.

11. A circuit device having an I/O (input/output) interface, the circuit device comprising:
a group of multiple signal lines that each interfaces to a hardware I/O buffer of the I/O interface of the circuit device to be tested wherein the multiple signal lines of each group share a common timing signal, wherein each of the signal lines is to receive bits of a test data sequence distributed to the group from a test source separate from the circuit device;
multiple error detection circuits, wherein each signal line of the group has an associated error detection circuit to detect an error for the signal line if any of the bits of the test data sequence are not received correctly by the I/O buffer for a given timing setting; and
a group detection circuit coupled to receive error detection indications from the multiple error detection circuits, the group detection circuit to accumulate pass/fail information detected for all signal lines of the group and send an error value to the test source only after errors for all bits of the test data sequence for all the signal lines of the group are accumulated.

12. The circuit device of claim 11, wherein the I/O interface comprises an interface of a wide interface memory device.

13. The circuit device of claim 11, wherein the group is one of multiple groups of the circuit device, wherein each group includes multiple circuit lines, multiple error detection circuits, and a group detection circuit.

14. The circuit device of claim 11, wherein the error detection circuits include a sticky error latch, which is set when the signal line does not receive the test data sequence correctly for any bit of the test data sequence.

15. The circuit device of claim 11, wherein the timing setting comprises a skew between a transmit clock and a receive clock.

16. The circuit device of claim 11, wherein the group detection circuit further comprises a counter to accumulate a passing count.

17. A system comprising:
a test source to generate a test data sequence;
a semiconductor wafer having multiple distinct circuit die processed in the wafer, each circuit die including
a group of multiple signal lines that each interfaces to a hardware I/O buffer of an I/O interface of the circuit die to be tested wherein the multiple signal lines of each group share a common timing signal, wherein each of the signal lines is to receive bits of the test data sequence distributed to the group from the test source separate from the circuit die;
multiple error detection circuits, wherein each signal line of the group has an associated error detection circuit to detect an error for the signal line if any of the bits of the test data sequence are not received correctly by the I/O buffer for a given timing setting; and
a group detection circuit coupled to receive error detection indications from the multiple error detection circuits, the group detection circuit to accumulate pass/fail information detected for all signal lines of the group and send an error value to the test source only after errors for all bits of the test data sequence for all the signal lines of the group are accumulated;
wherein the test data sequence is distributed to signal line groups on multiple circuit die on the semiconductor wafer to concurrently, indirectly test the I/O interface of the multiple circuit die.

18. The system of claim 17, wherein the group is one of multiple groups of the circuit device, wherein each group includes multiple circuit lines, multiple error detection circuits, and a group detection circuit.

19. The system of claim 17, wherein the error detection circuits include a sticky error latch, which is set when the signal line does not receive the test data sequence correctly for any bit of the test data sequence.

20. The system of claim 17, wherein the timing setting comprises a skew between a transmit clock and a receive clock.

* * * * *